United States Patent
Park et al.

(10) Patent No.: US 9,112,075 B2
(45) Date of Patent: Aug. 18, 2015

(54) CIGS- OR CZTS-BASED FILM SOLAR CELLS AND METHOD FOR PREPARING THE SAME

(71) Applicant: KOREA INSTITUTE OF SCIENCE AND TECHNOLOGY, Seoul (KR)

(72) Inventors: Jong Ku Park, Gyeonggi-do (KR); So Hye Cho, Seoul (KR); Bong Geun Song, Seoul (KR); Seung Yong Lee, Gyeonngi-do (KR); Bo In Park, Gyeonngi-do (KR); Hyung Ho Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/024,838

(22) Filed: Sep. 12, 2013

(65) Prior Publication Data

US 2014/0131728 A1    May 15, 2014

(30) Foreign Application Priority Data

Nov. 9, 2012 (KR) .................. 10-2012-0126525

(51) Int. Cl.
*H01L 31/072* (2012.01)
*H01L 31/032* (2006.01)
*H01L 31/0392* (2006.01)
*H01L 31/0749* (2012.01)

(52) U.S. Cl.
CPC ........ *H01L 31/0322* (2013.01); *H01L 31/0326* (2013.01); *H01L 31/03923* (2013.01); *H01L 31/072* (2013.01); *H01L 31/0749* (2013.01); *Y02E 10/541* (2013.01)

(58) Field of Classification Search
CPC ................................ H01L 33/36; H01L 33/38
See application file for complete search history.

(56) References Cited

U.S. PATENT DOCUMENTS

| | | | | |
|---|---|---|---|---|
| 5,981,868 A | * | 11/1999 | Kushiya et al. | ............... 136/262 |
| 2010/0078070 A1 | * | 4/2010 | Hosoya et al. | ............... 136/256 |
| 2012/0240989 A1 | * | 9/2012 | Ramanathan et al. | ........ 136/255 |

FOREIGN PATENT DOCUMENTS

| KR | 1020070099575 A | | 10/2007 |
|---|---|---|---|
| WO | WO2012089558 | * | 7/2012 |

OTHER PUBLICATIONS

Kundu et al. "Traps identification in Copper Indium Gallium Sulfur Selenide solar cell completed with various buffer layers by deep level transient spectroscopy," Thin Solid Films 515(2006) 2625-2631.*

* cited by examiner

*Primary Examiner* — Matthew Reames
(74) *Attorney, Agent, or Firm* — Ladas & Parry LLP (57) ABSTRACT

Provided is a copper indium gallium selenium (CIGS)- or copper zinc tin sulfur (CZTS)-based solar cell including a back electrode layer and a light-absorbing layer, wherein the light-absorbing layer has a composition of $Cu_xIn_yGa_{1-y}(S_zSe_{1-z})_2$ (wherein $0.85 \leq x < 1$, $0 < y < 1$, $0 < z < 1$, and each of x, y and z represents a real number) or $Cu_{(2-p)}Zn_{(2-q)}Sn_q(S_rSe_{(1-r)})_4$ (wherein $1.4 \leq p < 2$, $0 < q < 2$, $0 < r < 2$, and each of p, q and r represents a real number). The CIGS- or CZTS-based thin-film solar cell causes no interlayer delamination and has improved durability and photoelectric conversion efficiency. Also provided is a method for fabricating a CIGS- or CZTS-based thin-film solar cell by which conversion of molybdenum back electrode layer to molybdenum diselenide is controlled.

10 Claims, 7 Drawing Sheets

CIGS- OR CZTS-BASED FILM SOLAR CELLS AND METHOD FOR PREPARING THE SAME

CROSS-REFERENCE TO RELATED APPLICATIONS

This application claims priority under 35 U.S.C. §119 to Korean Patent Application No. 10-2012-0126525, filed on Nov. 9, 2012, in the Korean Intellectual Property Office, the disclosure of which is incorporated herein by reference in its entirety.

TECHNICAL FIELD

The following disclosure relates to a copper indium gallium selenium (CIGS)- or copper zinc tin sulfur (CZTS)-based thin-film solar cell and a method for fabricating the same. More particularly, the following disclosure relates to a CIGS- or CZTS-based thin-film solar cell having controlled thickness of molybdenum diselenide ($MoSe_2$) layer which enables interlayer delamination long-term durability and high photoelectric conversion efficiency, and a method for fabricating the same.

BACKGROUND

It can be said that a solar cell generating electricity directly from the sunlight is one of the most promising future energy generation systems because it generates clean energy safely. Most solar cells that have succeeded in commercialization to date are based on silicon materials. However, processes for producing silicon adequate for solar cells application require a large amount of investment in plant and equipment and maintenance and operation thereof. Thus, such solar cells based on silicon are disadvantageous in terms of cost efficiency. As a substitute for those cells, many attempts have been given to thin-film solar cells because they use a relatively low amount of raw materials and are applicable to flexible substrates due to their light weight. As a result, thin-film solar cells have increased rapidly in market share recently.

Among such thin-film solar cells, copper indium gallium selenium (also referred to as CIGS hereinafter) solar cells have a very high photoelectric conversion efficiency of 20% or higher. When considering the technical characteristics and development rate of thin-film solar cells, it is expected that the CIGS solar cells will predominate in commercialization of solar cells in the near future. In addition, solar cells based on copper zinc tin sulfur (also referred to as CZTS hereinafter) obtained by substituting indium and gallium in CIGS with zinc and tin, respectively, and substituting selenium partially or totally with sulfur have characteristics similar to those of CIGS-based solar cells and are significantly cost-effective compared to the CIGS-based solar cells because zinc and tin are quite cheaper than indium and gallium, respectively. Thus, the CZTS-based solar cells have been considered as one of the most promising solar cells.

In general, a CIGS- or CZTS-based thin film solar includes: a substrate; a molybdenum back electrode layer; a light-absorbing layer; a buffer layer; and a transparent electrode layer. Forming each layer with less defects as and sequentially superimposing each layer with less interfacial defects are crucial in order to obtain high photoelectric conversion efficiency in a thin-film solar cell. Among the several processes of thin-film solar cell fabrication, a selenization process is very important. Selenization is usually conducted at high temperature under inert or reductive atmosphere incorporating selenium vapor to induce either (or both) densification of a thin film of light-absorbing layer or (and) microstructure control such as grain growth and grain alignment (texturing). Thus, the selenization process affects the physical and optical properties of the light-absorbing layer and causes microstructural change, for example, transformation of the molybdenum back electrode layer to molybdenum diselenide ($MoSe_2$). Since molybdenum diselenide has very low unit cell density as compared to metallic molybdenum, selenization of molybdenum provides great volumetric expansion by about 4 times, as experimentally observed. Naturally, this large volume expansion during selenization of molybdenum induces high compressive stress between the molybdenum diselenide layer and the remaining molybdenum layer, leading to a main cause of interlayer delamination (partial or complete spallation of the back electrode) and finally mechanical failure of solar cells. Moreover, since the toughness of a molybdenum diselenide phase is significantly lower than that of molybdenum, the selenization of molybdenum is more detrimental to mechanical stability of the resultant thin-film solar cells.

The above-mentioned interlayer delamination prohibits construction of a high-efficiency thin-film solar cell because of severe mechanical damage and increased interlayer electrical resistance. Therefore, it is required to control the transport of selenium vapor from the selenization atmosphere to the molybdenum back electrode through a light-absorbing layer during selenization in order to prevent or minimize formation of molybdenum diselenide layer.

SUMMARY

An aspect of the present invention relates to a plurality of layers for fabricating a copper indium gallium selenium (CIGS)- or copper zinc tin sulfur (CZTS)-based solar cell, the plurality of layers comprising: a substrate; a molybdenum layer formed on the substrate; a copper layer formed on the molybdenum layer; and a light-absorbing powder layer formed on the copper layer.

According to an embodiment is disclosed the plurality of layers for fabricating a copper indium gallium selenium (CIGS)- or copper zinc tin sulfur (CZTS)-based solar cell, wherein the molybdenum layer comprises at least two molybdenum sub-layers that is formed at different formation conditions.

According to another embodiment is disclosed the plurality of layers for fabricating a copper indium gallium selenium (CIGS)- or copper zinc tin sulfur (CZTS)-based solar cell, wherein the light-absorbing powder layer has a composition of $Cu_xIn_yGa_{1-y}(S_zSe_{1-z})_2$ (wherein $0 \leq x<1$, $0<y<1$, $0<z<1$, and each of x, y and z represents a real number) or $Cu_{(2-p)}Zn_{(2-q)}Sn_q(S_rSe_{(1-r)})_4$ (wherein $0<p<2$, $0<q<2$, $0<r<2$, and each of p, q and r represents a real number), and the light-absorbing powder layer is formed by conducting at least one non-vacuum type process selected from the group consisting of a doctor blade coating process, a screen printing process, a spin coating process, a spray coating process, and a painting process.

According to an further embodiment is disclosed the plurality of layers for fabricating a copper indium gallium selenium (CIGS)- or copper zinc tin sulfur (CZTS)-based solar cell according to claim 1, wherein the molybdenum layer has a thickness of 0.5-5 μm and the copper layer has a thickness corresponding to 1-10% of the thickness of the light-absorbing powder layer.

Another aspect of the present invention relates to a method for fabricating a copper indium gallium selenium (CIGS)- or copper zinc tin sulfur (CZTS)-based solar cell, comprising: forming a molybdenum layer on one surface of a substrate; forming a copper layer on the molybdenum layer; forming a light-absorbing powder layer of copper indium gallium selenium or copper zinc tin sulfur on the copper layer; and heat-treating the layers.

According to an embodiment is disclosed the method for fabricating a copper indium gallium selenium (CIGS)- or copper zinc tin sulfur (CZTS)-based solar cell according to claim 5, wherein the substrate is selected from the group consisting of glass, metal, ceramics, and polymers.

According to another embodiment is disclosed the method for fabricating a copper indium gallium selenium (CIGS)- or copper zinc tin sulfur (CZTS)-based solar cell according to claim 5, wherein said forming a molybdenum layer comprises conducting at least one process selected from the group consisting of an electron beam coating, sputtering, chemical vapor deposition, and metal-organic chemical vapor deposition process.

According to a further embodiment is disclosed the method for fabricating a copper indium gallium selenium (CIGS)- or copper zinc tin sulfur (CZTS)-based solar cell according to claim 5, wherein said forming a copper layer comprises conducting at least one process selected from the group consisting of a (thermal) vacuum evaporation, electron beam coating, sputtering, chemical vapor deposition (CVD), metal-organic chemical vapor deposition (MOCVD), and electrochemical deposition process.

According to still another embodiment is disclosed the method for fabricating a copper indium gallium selenium (CIGS)- or copper zinc tin sulfur (CZTS)-based solar cell according to claim 5, wherein the light-absorbing powder layer has a composition of $Cu_xIn_yGa_{1-y}(S_zSe_{1-z})_2$ (wherein $0<x<1$, $0<y<1$, $0<z<1$, and each of x, y and z represents a real number) or $Cu_{(2-p)}Zn_{(2-q)}Sn_q(S_rSe_{(1-r)})_4$ (wherein $0<p<2$, $0<q<2$, $0<r<2$, and each of p, q and r represents a real number), and said forming a light-absorbing powder layer comprises conducting at least one process selected from the group consisting of a non-vacuum type process including a doctor blade coating process, a screen printing process, a spin coating process, a spray coating process, and a painting process, under non-vacuum environment.

According to still another embodiment is disclosed the method for fabricating a copper indium gallium selenium (CIGS)- or copper zinc tin sulfur (CZTS)-based solar cell according to claim 5, wherein said heat-treating the layers is conducted with inert or reductive selenium gas at 250-900° C., and the copper has a composition of $Cu_xIn_yGa_{1-y}(S_zSe_{1-z})_2$ (wherein $0.85 \leq x<1$, $0<y<1$, $0<z<1$, and each of x, y and z represents a real number) or $Cu_{(2-p)}Zn_{(2-q)}Sn_q(S_rSe_{(1-r)})_4$ (wherein $1.4 \leq p<2$, $0<q<2$, $0<r<2$, and each of p, q and r represents a real number).

According to still another embodiment is disclosed the method for fabricating a copper indium gallium selenium (CIGS)- or copper zinc tin sulfur (CZTS)-based solar cell according to claim 5, which further comprises forming a buffer layer on the light-absorbing layer, and said forming buffer layer is conducted by depositing CdS, ZnS(O,OH), ZnSe, InS(O,OH), $In_2S_3$, $ZnIn_xSe_y$, $Zn_{1-x}Mg_xO$ (wherein $0<x<1$, $0<y<1$, and each of x and y represents a real number) or a combination thereof through at least one process selected from the group consisting of a chemical bath deposition (CBD), electron beam coating, sputtering, and chemical vapor deposition (CVD) process.

According to still another embodiment is disclosed the method for fabricating a copper indium gallium selenium (CIGS)- or copper zinc tin sulfur (CZTS)-based solar cell according to claim 11, which further comprises forming a transparent electrode layer on the buffer layer, and said forming a transparent electrode layer is conducted by depositing ZnO, aluminum-doped zinc oxide (AZO), boron-doped zinc oxide (BZO), indium tin oxide (ITO), fluorine-doped tin oxide (FTO) or a combination thereof through an electron beam coating or sputtering process.

Still another aspect of the present invention relates to a copper indium gallium selenium (CIGS)- or copper zinc tin sulfur (CZTS)-based solar cell obtained by any of the aforementioned methods.

An embodiment of the present disclosure is directed to providing a copper (Cu)-coated molybdenum back electrode (called CMBE hereinafter for simplicity) for fabricating a copper indium gallium selenium (CIGS)- or copper zinc tin sulfur (CZTS)-based solar cell, wherein the CMBE plays a role to reduce formation of molybdenum diselenide during selenization process and thereby to prevent interlayer delamination, which ensures long-term mechanical durability and high photoelectric conversion efficiency.

Another embodiment of the present disclosure is directed to providing a fabrication method for a CIGS- or CZTS-based thin-film solar cell which allows control of conversion of a molybdenum back electrode layer to molybdenum diselenide.

Still another embodiment of the present disclosure is directed to providing a CIGS- or CZTS-based thin-film solar cell obtained by the above-mentioned method and having an adequately controlled ratio of molybdenum diselenide to molybdenum, thereby preventing interlayer delamination and degradation of durability and photoelectric conversion efficiency.

In one general aspect, there is provided a CMBE for fabricating a copper indium gallium selenium (CIGS)- or copper zinc tin sulfur (CZTS)-based solar cell, comprised of several components including: a substrate; a molybdenum layer (which can be comprised of two kinds of molybdenum layers with different microstructural characteristics due to adapting different coating conditions, respectively); and a copper layer. (For comparison with conventional terminology in the CIGS- and CZTS-based thin-film solar cells, double or triple layers of molybdenum and copper in this CMBE correspond to a molybdenum back electrode in the conventional solar cells.)

According to an embodiment, the light-absorbing powder layer overcoated on the CMBE may have a composition of $Cu_xIn_yGa_{1-y}(S_zSe_{1-z})_2$ (wherein $0<x<1$, $0<y<1$, $0<z<1$, and each of x, y and z represents a real number) or $Cu_{(2-p)}Zn_{(2-q)}Sn_q(S_rSe_{(1-r)})_4$ (wherein $0<p<2$, $0<q<2$, $0<r<2$, and each of p, q and r represents a real number); and may be applied by a non-vacuum type process including a doctor blade coating process, a screen printing process, a spin coating process, a spray coating process or a painting process.

According to another embodiment, the molybdenum layer may have a thickness of 0.5-5 μm; and the copper layer may have a thickness corresponding to 1-10% of the thickness of the light-absorbing powder layer to be overcoated on the CMBE.

In another general aspect, there is provided a method for fabricating a CIGS- or CZTS-based solar cell, including:
 forming a molybdenum layer on one surface of a substrate;
 forming a copper thin film on the molybdenum layer;
 forming a light-absorbing layer of copper indium gallium selenium or copper zinc tin sulfur on the CMBE for fabricating a CIGS- or CZTS-based solar cell; and
 heat-treating the light-absorbing layer fabricated on the CMBE to obtain target microstructures and composition.

According to an embodiment, the substrate may be selected from the group consisting of glass, metal, ceramics and polymers.

According to another embodiment, the process of forming a molybdenum layer may be carried out by coating molybdenum onto a substrate through an electron beam coating, sputtering, chemical vapor deposition or metal-organic chemical vapor deposition process.

According to still another embodiment, the process of forming a copper layer may be carried out by coating a copper layer superimposedly onto the molybdenum layer through a (thermal) vacuum evaporation, electron beam coating, sputtering, chemical vapor deposition (CVD), metal-organic chemical vapor deposition (MOCVD) or electrochemical deposition process.

According to still another embodiment, the process of forming a light-absorbing powder layer on the CMBE for a CIGS- or CZTS-based solar cell may include applying powder or paste having a composition of $Cu_xIn_yGa_{1-y}(S_zSe_{1-z})_2$ (wherein 0<x<1, 0<y<1, 0<z<1, and each of x, y and z represents a real number) or $Cu_{(2-p)}Zn_{(2-q)}Sn_q(S_rSe_{(1-r)})_4$ (wherein 0<p<2, 0<q<2, 0<r<2, and each of p, q and r represents a real number) through a non-vacuum type process including a doctor blade coating process, a screen printing process, a spin coating process, a spray coating process or a painting process, under non-vacuum environment.

According to still another embodiment, the process of heat-treating the light-absorbing powder layer formed on the CMBE may include heat-treatment under inert or reductive selenium gas atmosphere at 250-900° C., and the copper layer in the CMBE may be absorbed or diffused to the light-absorbing layer during the heat-treatment so that the composition of the light-absorbing layer may be changed to $Cu_xIn_yGa_{1-y}(S_zSe_{1-z})_2$ (wherein 0.85≤x<1, 0<y<1, 0<z<1, and each of x, y and z represents a real number) or $Cu_{(2-p)}Zn_{(2-q)}Sn_q(S_rSe_{(1-r)})_4$ (wherein 1.4≤p<2, 0<q<2, 0<r<2, and each of p, q and r represents a real number).

According to still another embodiment, the method may further include forming a buffer layer on top of the light-absorbing layer by depositing CdS, ZnS(O,OH), ZnSe, InS(O,OH), $In_2S_3$, $ZnIn_xSe_y$, $Zn_{1-x}Mg_xO$ (wherein 0<x<1, 0<y<1, and each of x and y represents a real number) or a combination thereof through a chemical bath deposition (CBD), electron beam coating, sputtering or chemical vapor deposition (CVD) process.

According to yet another embodiment, the method may further include forming a transparent electrode layer on top of the light-absorbing layer by depositing ZnO, aluminum-doped zinc oxide (AZO), boron-doped zinc oxide (BZO), indium tin oxide (ITO), fluorine-doped tin oxide (FTO) or a combination thereof through an electron beam coating or sputtering process.

In still another general aspect, there is provided a CIGS- or CZTS-based solar cell obtained by the above-described method.

According to the present disclosure, it is possible to obtain a CIGS- or CZTS-based thin-film solar cell causing no interlayer delamination and having both improved durability and photoelectric conversion efficiency. It is also possible to realize a method for fabricating a CIGS- or CZTS-based thin-film solar cell by which conversion of molybdenum back electrode layer to molybdenum diselenide is minimized.

BRIEF DESCRIPTION OF THE DRAWINGS

The above and other aspects, features and advantages of the disclosed exemplary embodiments will be more apparent from the following detailed description taken in conjunction with the accompanying drawings in which.

<Detailed Description of Main Elements>

| | |
|---|---|
| 100: substrate | 200: molybdenum back electrode layer |
| 210: molybdenum diselenide layer | |
| 300: light-absorbing layer | 310: light-absorbing powder layer |
| 400: buffer layer | 500: transparent electrode layer |
| 800: copper thin film | |

DETAILED DESCRIPTION OF EMBODIMENTS

The advantages, features and aspects of the present disclosure will become apparent from the following description of the embodiments with reference to the accompanying drawings, which is set forth hereinafter.

Figure 1:
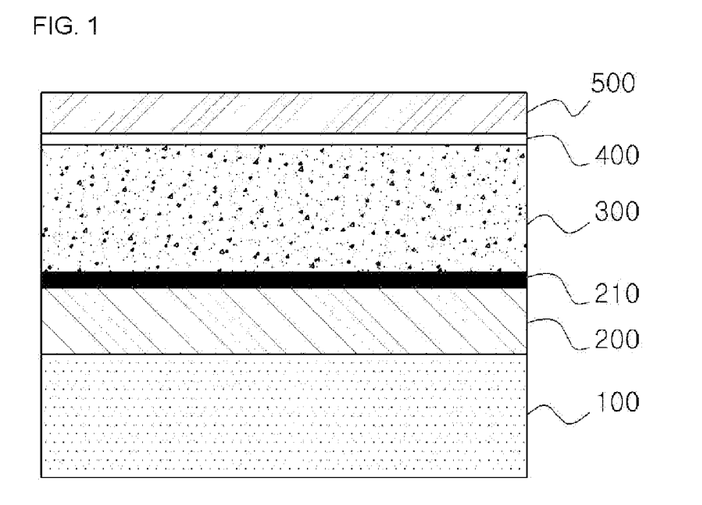
FIG. 1 is a schematic view illustrating the copper indium gallium selenium (CIGS)- or copper zinc tin sulfur (CZTS)-based solar cell according to an embodiment.
Figure 2:
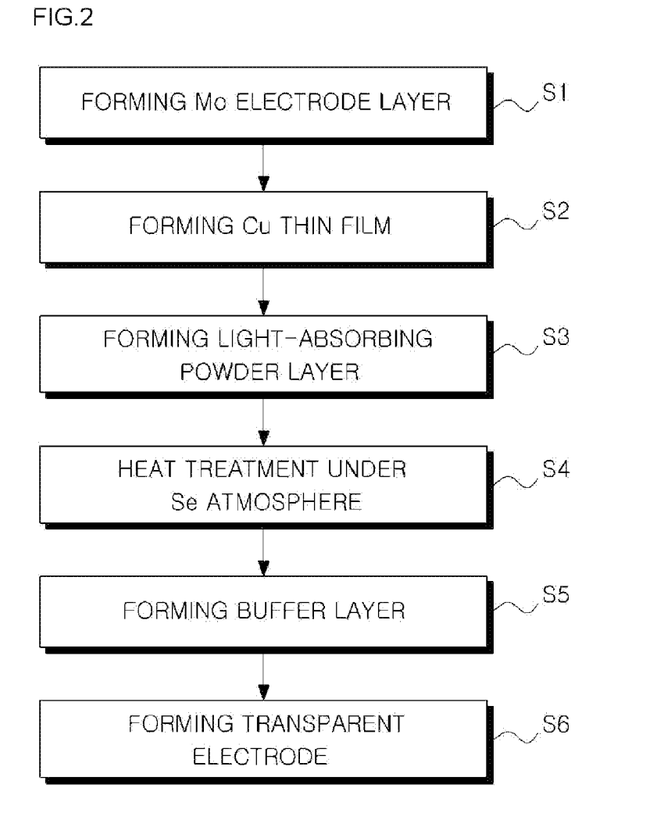
FIG. 2 is a schematic flow chart illustrating the method for fabricating a solar cell according to an embodiment.

FIG. 1 is a schematic view illustrating the copper indium gallium selenium (CIGS)- or copper zinc tin sulfur (CZTS)-based thin-film solar cell according to an embodiment, and FIG. 2 is a schematic flow chart illustrating the method for fabricating a CIGS- or CZTS-based solar cell according to an embodiment. As shown in FIG. 1 and FIG. 2, a molybdenum back electrode layer 200 is formed first on one surface of a substrate 100 (S1). For example, the substrate may be selected from the group consisting of glass, metals, ceramics and polymers, but is not limited thereto. There is no particular limitation in physical/chemical properties of the material of the substrate 100, as long as the material allows deposition of molybdenum and is applicable as a solar cell substrate.

The operation (S1) may be carried out by depositing molybdenum onto the substrate 100 through an electron beam coating process, a sputtering process, a chemical vapor deposition (CVD) process or a metal-organic chemical vapor deposition (MOCVD) process. Deposition of molybdenum on the substrate 100 may be carried out by any process known to those skilled in the art. The formed molybdenum back electrode layer is not limited in its thickness. However, the molybdenum back electrode layer may be formed to a thickness of 0.5-5 μm to provide a thin-film solar cell having an efficient thickness.

Next, a copper thin film is formed on the molybdenum back electrode layer (S2). Various processes known to those skilled in the art may be selected to form a copper thin film and to perform deposition thereof. Although there is no particular limitation in the process for forming a copper thin film, the copper thin film may be formed through a (thermal) vacuum evaporation process, an electron beam coating process, a sputtering process, a CVD process, an MOCVD process or an electrochemical deposition process. Particularly, a sputtering process may be used under inert gas atmosphere. The copper thin film is to be removed by being absorbed or diffused to a light-absorbing layer 300 in the subsequent heat treatment operation (S4), and thus is not shown in FIG. 1 which illustrates the structure of a finished solar cell schematically. The thickness and density of the copper thin film may be determined in such a manner that, upon heat treatment, the resultant light-absorbing layer has a composition of $Cu_xIn_yGa_{1-y}(S_zSe_{1-z})_2$ (wherein 0.85≤x<1, 0<y<1, 0<z<1, and each of x, y and z represents a real number) or $Cu_{(2-p)}Zn_{(2-q)}Sn_q(S_rSe_{(1-r)})_4$ (wherein 1.4≤p<2, 0<q<2, 0<r<2, and each of p, q and r represents a real number) with a desired thickness. For example, the copper thin film may be formed to have a thickness corresponding to 1-10% of the thickness of the heat-treated light-absorbing layer.

Then, a light-absorbing powder layer (not shown in FIG. 1) containing copper indium gallium selenium (CIGS) or copper zinc tin sulfur (CZTS) is formed on the copper thin film (S3). In this manner, provided is a pre-treated thin film for fabricating a CIGS- or CZTS-based solar cell, including a substrate; a molybdenum back electrode layer; a copper thin film; and a light-absorbing powder layer. The operation (S3) may be carried out by applying, onto the copper thin film, CIGS or CZTS powder or paste having a composition of $Cu_xIn_yGa_{1-y}(S_zSe_{1-z})_2$ (wherein 0<x<1, 0<y<1, 0<z<1, and each of x, y and z represents a real number) or $Cu_{(2-p)}Zn_{(2-q)}Sn_q(S_rSe_{(1-r)})_4$ (wherein 0<p<2, 0<q<2, 0<r<2, and each of p, q and r represents a real number), through a non-vacuum type process including a doctor blade coating process, a screen printing process, a spin coating process, a spray coating process or a painting process.

Then, the pre-treated thin film for fabricating a CIGS- or CZTS-based solar cell obtained as described above is heat treated with inert or reductive selenium gas at 250-900° C. (S4). After the heat treatment (S4), the light-absorbing powder layer 310 is densified so that it is converted to a light-absorbing layer 300.

Figure 3:
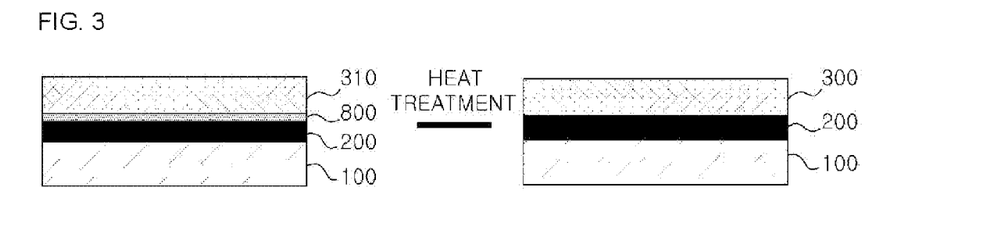
FIG. 3 is a schematic view showing a molybdenum back electrode layer, a copper thin film layer and a light-absorbing layer, before and after heat treatment in the method for fabricating a solar cell according to an embodiment.

According to the present disclosure, while the light-absorbing layer 300 is formed through the heat treatment S4 with selenium gas, the copper thin film functions as a barrier that prevents penetration of selenium gas into the molybdenum back electrode layer 200. In addition, production of molybdenum diselenide 210 is controlled desirably depending on the density or thickness of the copper thin film. At the same time, the copper thin film is removed by being absorbed or diffused to the light-absorbing layer 300 gradually under such high-temperature environment of 250-900° C., as mentioned above. The operation (S4) is shown schematically in FIG. 3, showing a substrate 100, a molybdenum back electrode layer 200, a light-absorbing powder layer 310 and a light-absorbing layer 300. Herein, the light-absorbing powder layer 310 which has been applied as a powder or paste phase initially is converted to a light absorbing layer 300 including the copper thin film 800 incorporated thereto and having a composition of $Cu_xIn_yGa_{1-y}(S_zSe_{1-z})_2$ (wherein 0.85≤x<1, 0<y<1, 0<z<1, and each of x, y and z represents a real number) or $Cu_{(2-p)}Zn_{(2-q)}Sn_q(S_rSe_{(1-r)})_4$ (wherein 1.4≤p<2, 0<q<2, 0<r<2, and each of p, q and r represents a real number).

This suggests that introduction of a copper thin film functions as an improved controller against production of molybdenum diselenide (210 in FIG. 1). As a result, it is possible to inhibit excessive production of molybdenum diselenide 210 or induce formation of molybdenum diselenide in its desired amount by controlling the thickness and density of the copper thin film.

As described above, molybdenum diselenide 210 has poor toughness and is damaged easily. Moreover, when molybdenum is converted to molybdenum diselenide, significant volumetric expansion occurs since molybdenum diselenide has 4 times lower unit cell density as compared to molybdenum and, therefore, compression stress is applied onto the molybdenum diselenide layer. Thus, an excessively large amount of molybdenum diselenide formation causes interlayer delamination, which severely degrades cell durability and photoelectric conversion efficiency of a solar cell. The method for fabricating a CIGS- or CZTS-based thin-film solar cell disclosed herein allows control of the production of molybdenum diselenide 210 with ease. As a result, the thin-film solar cell obtained by the method disclosed herein does not show the problem caused by molybdenum diselenide, and thus can be used for a long time and provide high photoelectric conversion efficiency.

After the completion of the heat treatment (S4), a buffer layer 400 is formed on the light-absorbing layer 300 (S5). The buffer layer 400 may include CdS, ZnS(O,OH), ZnSe, InS(O, OH), $In_2S_3$, $ZnIn_xSe_y$, $Zn_{1-x}Mg_xO$ (wherein 0<x<1, 0<y<1, and each of x and y represents a real number) or a combination thereof, and may be formed through a chemical bath deposition (CBD), electron beam coating, sputtering or chemical vapor deposition (CVD) process. However, the above-listed compositions and processes for forming a buffer layer are for illustrative purposes only and any compositions and processes known to those skilled in the art may be used to form a buffer layer. Thus, the composition and process for forming a buffer layer is not limited to the above examples. Moreover, a buffer layer may be previously formed on the substrate. In this case, the operation of forming a buffer layer may be omitted. Optionally, no buffer layer may be formed.

Then, a transparent electrode layer 500 is formed on the buffer layer 400 (S6). The transparent electrode layer 500 may include ZnO, aluminum-doped zinc oxide (AZO), boron-doped zinc oxide (BZO), indium tin oxide (ITO), fluorine-doped tin oxide (FTO) or a combination thereof, and may be formed through, for example, a sputtering process. The above-mentioned compositions and process for forming a transparent electrode layer of a thin-film solar cell are for illustrative purposes only, and any compositions and processes generally known to those skilled in the art may be used to form a transparent electrode layer. Thus, the composition and process for forming a transparent electrode layer is not limited to the above examples. Moreover, a transparent electrode layer may be previously formed on the substrate. In this case, the operation of forming a transparent electrode layer may be omitted. Optionally, no transparent electrode layer may be formed.

According to the method for fabricating a CIGS- or CZTS-based thin-film solar cell disclosed herein, it is possible to provide a CIGS- or CZTS-based thin-film solar cell including: a substrate 100; a molybdenum back electrode layer 200; a light-absorbing layer 300; a buffer layer 400; and a transparent electrode layer 500, wherein production of molybdenum diselenide is controlled during selenization, so that interlayer delamination is prevented and durability and photoelectric conversion efficiency are improved. In addition, in the CIGS- or CZTS-based thin-film solar cell disclosed herein, conversion of molybdenum back electrode layer to molybdenum diselenide is controlled desirably. As described herein, due to the diffusion or absorption of a copper thin film, the light-absorbing layer of the CIGS- or CZTS-based thin-film solar cell has a composition of $Cu_xIn_yGa_{1-y}(S_zSe_{1-z})_2$ (wherein $0.85 \leq x < 1$, $0 < y < 1$, $0 < z < 1$, and each of x, y and z represents a real number) or $Cu_{(2-p)}Zn_{(2-q)}Sn_q(S_rSe_{(1-r)})_4$ (wherein $1.4 \leq p < 2$, $0 < q < 2$, $0 < r < 2$, and each of p, q and r represents a real number).

Figure 9:
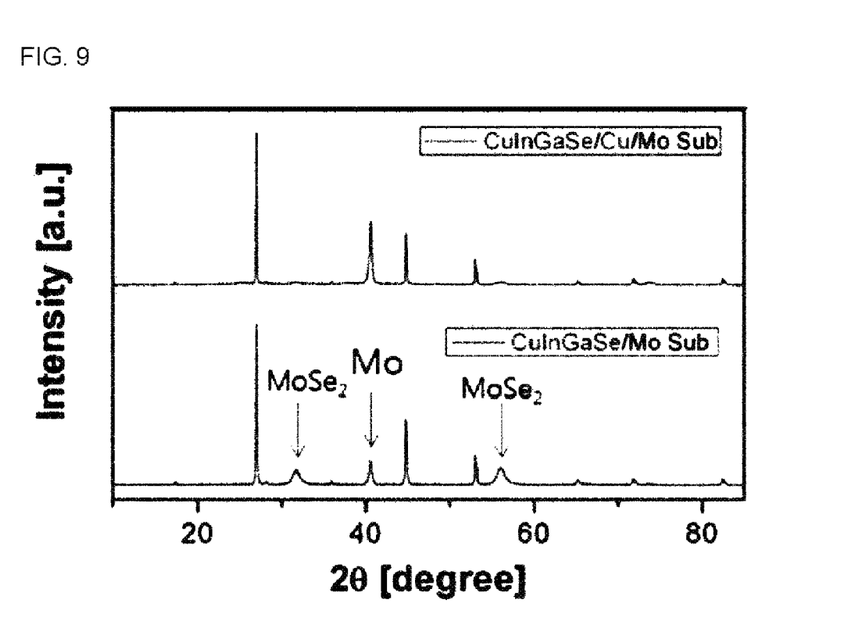
FIG. 9 is a graph showing the X-ray diffraction (XRD) pattern of a thin film of light-absorbing layer according to an embodiment, compared with the XRD pattern of a thin film of light-absorbing layer of Comparative Example obtained without applying a copper thin film layer.

Further, when minimizing such conversion of molybdenum to molybdenum diselenide according to embodiments of the present disclosure, the molybdenum back electrode layer of the CIGS- or CZTS-based thin-film solar cell disclosed herein is characterized in that the ratio of the peak intensity observed at 2θ of molybdenum diselenide to the peak intensity observed at 2θ of molybdenum in an X-ray diffraction (XRD) test is within a range of 1:10-25, wherein 2θ of molybdenum diselenide is 32°±0.5° or 57°±0.5°, and 2θ of molybdenum is 40.5°±0.5° (see top of FIG. 9, XRD graph).

EXAMPLES

The examples and experiments will now be described. The following examples and experiments are for illustrative purposes only and not intended to limit the scope of this disclosure.

Example

Fabrication of Copper Indium Gallium Selenium (CIGS)-Based Thin-film Solar Cell

1) Formation of Molybdenum Back Electrode Layer

Figure 4:
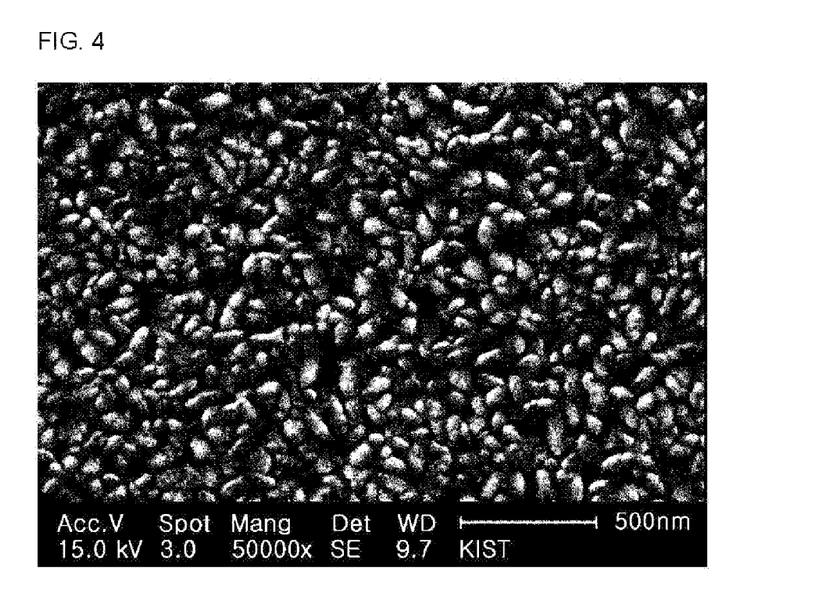
FIG. 4 is a scanning electron microscopic (SEM) image showing a molybdenum back electrode layer in the method for fabricating a solar cell according to an embodiment.

First, a soda-lime glass substrate is washed with an organic solvent and distilled water and dried at 60° C. for 12 hours. A metallic molybdenum back electrode layer is deposited on the dried soda-lime glass substrate through a DC sputtering process using a molybdenum target (purity: 99.999%) under argon atmosphere of 5 mTorr at DC 150 W for 50 minutes. The deposited molybdenum back electrode layer has a thickness of about 1 μm, a grain size of about 100 nm (see FIG. 4), and a sheet resistance of about 0.18 Ω/□.

2) Formation of Copper Thin Film

Figure 5:
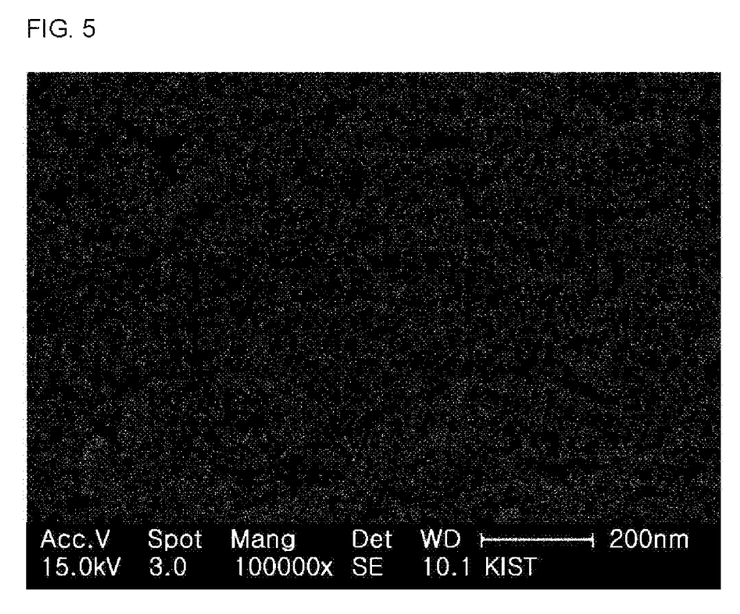
FIG. 5 is an SEM image showing a copper thin film in the method for fabricating a solar cell according to an embodiment.

A copper thin film with a thickness of 100 nm is deposited on the molybdenum electrode through a DC sputtering process using a copper target (purity: 99.999%) under argon atmosphere of 5 mTorr at DC 100 W for 3 minutes and 40 seconds (see FIG. 5).

3) Formation of CIGS Thin Film (Light-Absorbing Powder Layer or Light-Absorbing Layer)

Figure 6:
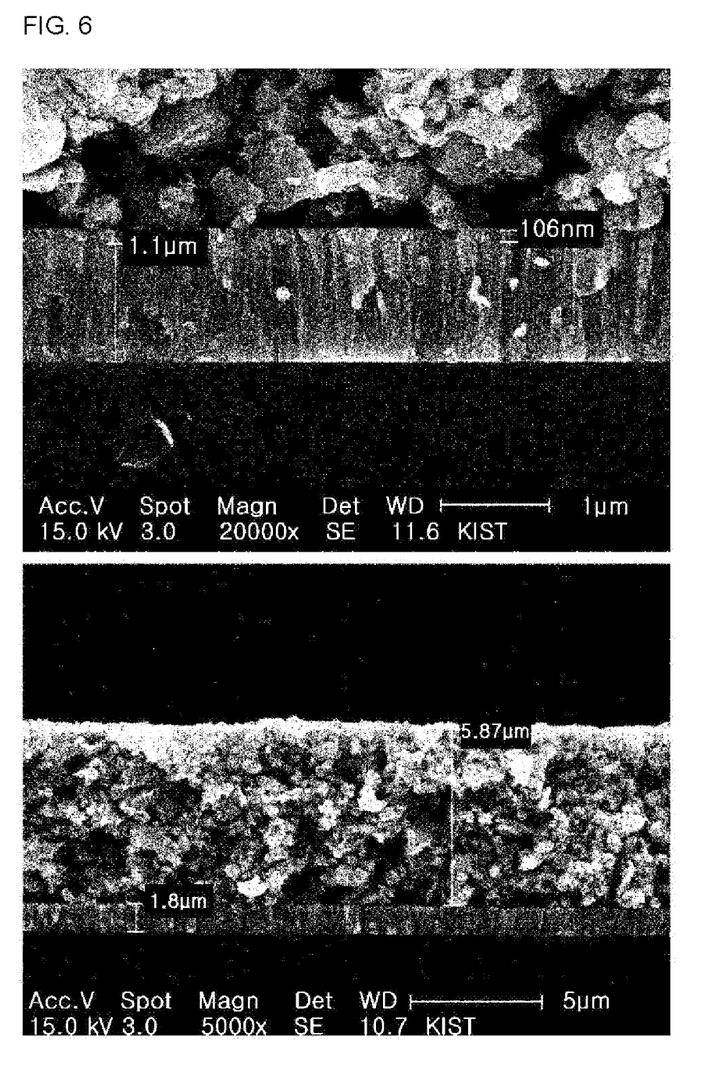
FIG. 6 is an SEM image showing a light-absorbing powder layer applied on a copper thin film in the method for fabricating a solar cell according to an embodiment.
Figure 7:
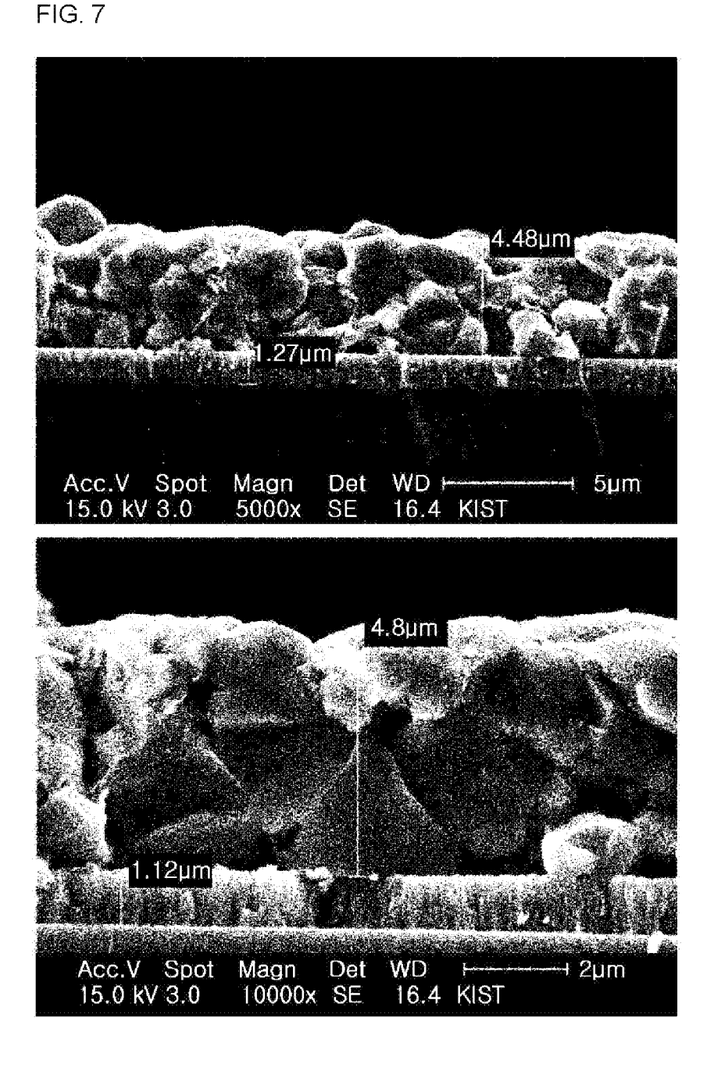
FIG. 7 is an SEM image showing a thin film of light-absorbing layer, after it is heat-treated with selenium gas, in the method for fabricating a solar cell according to an embodiment.

A coating solution containing CIGS powder dispersed homogeneously therein is used to apply a CIGS thin film on the Cu/Mo/soda-lime glass substrate obtained as described above through a screen printing process to form a CIGS layer (light-absorbing layer) having a thickness of 6-8 μm as shown in FIG. 6. The resultant CIGS layer is heat treated with a selenium source under argon gas atmosphere containing 4% of hydrogen at 550° C. for 1 hour. By doing so, the light-absorbing powder layer is converted to a light-absorbing layer, while the copper thin film is absorbed into the light-absorbing layer and the molybdenum electrode layer becomes in direct contact with the sintered CIGS light-absorbing layer (see FIG. 3 and FIG. 7). Depending on the selenization conditions, if the copper thin film is absorbed and selenization occurs further, a part of the molybdenum thin film may form a molybdenum diselenide layer present between the light-absorbing layer and the molybdenum thin film It is possible to control the thickness of the molybdenum diselenide layer as desired by adjusting the thickness and density of the copper thin film.

4) Formation of Buffer Layer and Transparent Electrode Layer

A CdS layer with a thickness of 50 nm is formed on the CIGS thin film through a chemical bath deposition (CBD) process, and then a ZnO target is used to deposit an i-type ZnO transparent electrode to a thickness of 50 nm through an RF sputtering process. In addition, an aluminum-doped ZnO (AZO) target is used to deposit an AZO transparent electrode to a thickness of 500 nm through the same RF sputtering process to provide a solar cell. Further, a grid electrode formed of Ni 50 nm and Al 1 μm is formed on the surface of the solar cell through a heat evaporation process using a grid mask pattern in order to collect electric current.

Comparative Example

Fabrication of CIGS-Based Thin-film Solar Cell

Figure 8:
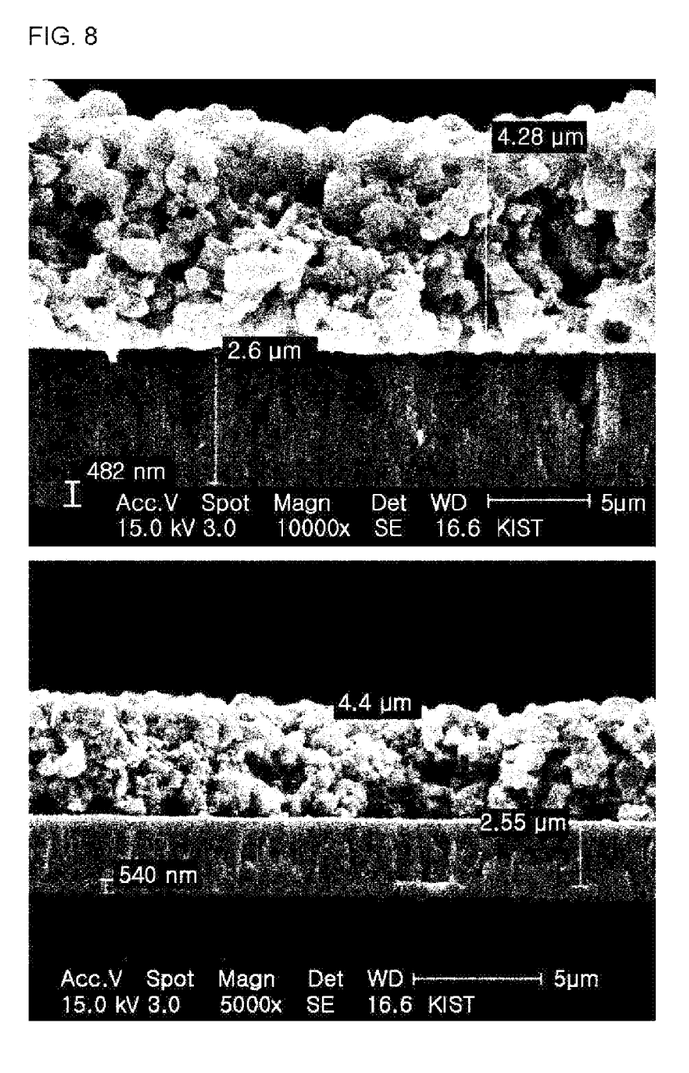
FIG. 8 is an SEM image showing a thin film of light-absorbing layer after it is heat-treated with selenium gas in the method for fabricating a solar cell in which an operation of applying a copper thin film layer is omitted according to Comparative Example.

The same process as described in Example is repeated to provide a CIGS-based thin-film solar cell, except that the operation of forming a copper thin film is not carried out. The SEM image of the thin film of light-absorbing layer of the obtained solar cell is shown in FIG. 8. It can be seen that the selenization caused conversion of 56% of the molybdenum electrode layer (0.62-μm out of 1.1-μm thickness) to molybdenum diselenide layer. The 2.6-μm thick molybdenum diselenide is formed due to volumetric expansion by conversion of 0.62-μm thick molybdenum layer.

Test Example and Comparative Test Example

To compare the selenization degree of the molybdenum back electrode layer of Example with that of Comparative Example, the X-ray diffraction (XRD; Bruker D8 Advance) patterns of the thin films (FIG. 7 and FIG. 8) are shown in FIG. 9 (top=Example, bottom=Comparative Example). The thin film of Example mainly shows a pattern of molybdenum as well as that of the CIGS light-absorbing layer. It can be observed that the intensity of the molybdenum peak (Mo, 2θ=40.5°±0.5°) is approximately 20 times higher than that of the molybdenum diselenide peak ($MoSe_2$, 2θ=32°±0.5° or 57°±0.5°). On the contrary, the thin film of Comparative Example shows a smaller molybdenum (Mo) peak and a larger molybdenum diselenide ($MoSe_2$) peak (The molybdenum peak is approximately 1.2 times of the molybdenum diselenide peak).

As can be seen from the foregoing, according to the present disclosure, it is possible to control the amount of molybdenum diselenide of a thin-film solar cell as intended during selenization, and thus to solve the problems of interlayer delamination and degradation of durability and photoelectric conversion efficiency caused by volumetric expansion of molybdenum diselenide.

While the present disclosure has been described with respect to the specific embodiments, it will be apparent to those skilled in the art that various changes and modifications may be made without departing from the spirit and scope of the disclosure as defined in the following claims.

What is claimed is:

1. A method for fabricating a copper indium gallium selenium (CIGS)-, copper zinc tin sulfur (CZTS)-, copper indium gallium selenium sulfur (CIGSS)- or copper zinc tin sulfur selenium (CZTSS)- based solar cell, comprising:
   forming a molybdenum layer on one surface of a substrate;
   forming a copper layer on the molybdenum layer;
   forming a light-absorbing powder layer of copper indium gallium selenium or copper zinc tin sulfur on the copper layer; and
   heat-treating the layers in an atmosphere comprising selenium under conditions wherein the light-absorbing powder layer is converted to a light-absorbing layer, wherein a density and thickness of the copper layer are selected such that the copper layer controls formation of molybdenum diselenide to within a desired limit and such that the copper layer is removed by being absorbed or diffused to the light-absorbing layer as a result of the heat-treating.

2. The method according to claim 1, wherein the substrate is selected from the group consisting of glass, metal, ceramics, and polymers.

3. The method according to claim 1, wherein said forming a molybdenum layer comprises conducting at least one process selected from the group consisting of an electron beam coating, sputtering, chemical vapor deposition, and metal-organic chemical vapor deposition process.

4. The method according to claim 1, wherein said forming a copper layer comprises conducting at least one process selected from the group consisting of a (thermal) vacuum evaporation, electron beam coating, sputtering, chemical vapor deposition (CVD), metal-organic chemical vapor deposition (MOCVD), and electrochemical deposition process.

5. The method according to claim 1, wherein the light-absorbing powder layer has a composition of $Cu_xIn_yGa_{1-y}(S_zSe_{1-z})_2$ (wherein $0<x<1$, $0<y<1$, $0<z<1$, and each of x, y and z represents a real number) or $Cu_{(2-p)}Zn_{(2-q)}Sn_q(S_rSe_{(1-r)})_4$ (wherein $0<p<2$, $0<q<2$, $0<r<2$, and each of p, q and r represents a real number), and said forming a light-absorbing powder layer comprises conducting at least one process selected from the group consisting of a non-vacuum type process including a doctor blade coating process, a screen printing process, a spin coating process, a spray coating process, and a painting process, under non-vacuum environment.

6. The method according to claim 1, wherein said heat-treating the layers is conducted with inert or reductive selenium gas at 250-900° C., and the copper has a composition of $Cu_xIn_yGa_{1-y}(S_zSe_{1-z})_2$ (wherein $0.85 \leq x<1$, $0<y<1$, $0<z<1$, and each of x, y and z represents a real number) or $Cu_{(2-p)}Zn_{(2-q)}Sn_q(S_rSe_{(1-r)})_4$ (wherein $1.4 \leq p<2$, $0<q<2$, $0<r<2$, and each of p, q and r represents a real number).

7. The method according to claim 1, which further comprises forming a buffer layer on the light-absorbing layer, and said forming buffer layer is conducted by depositing CdS, ZnS(O,OH), ZnSe, InS(O,OH), $In_2S_3$, $ZnIn_xSe_y$, $Zn_{1-x}Mg_xO$ (wherein $0<x<1$, $0<y<1$, and each of x and y represents a real number) or a combination thereof through at least one process selected from the group consisting of a chemical bath deposition (CBD), electron beam coating, sputtering, and chemical vapor deposition (CVD) process.

8. The method according to claim 7, which further comprises forming a transparent electrode layer on the buffer layer, and said forming a transparent electrode layer is conducted by depositing ZnO, aluminum-doped zinc oxide (AZO), boron-doped zinc oxide (BZO), indium tin oxide (ITO), fluorine-doped tin oxide (FTO) or a combination thereof through an electron beam coating or sputtering process.

9. The method according to claim 1, wherein the heat treating is conducted at a temperature of 250 to 900° C.

10. The method according to claim 9, wherein the copper layer is formed to have a thickness corresponding to 1-10% of the thickness of the light-absorbing layer.

* * * * *